United States Patent
Satoh et al.

(10) Patent No.: US 9,548,448 B1
(45) Date of Patent: *Jan. 17, 2017

(54) MEMORY DEVICE WITH INCREASED SEPARATION BETWEEN MEMORY ELEMENTS

(71) Applicant: Avalanche Technology, Inc., Fremont, CA (US)

(72) Inventors: Kimihiro Satoh, Fremont, CA (US); Bing K. Yen, Cupertino, CA (US); Dong Ha Jung, Pleasanton, CA (US); Yiming Huai, Pleasanton, CA (US)

(73) Assignee: Avalanche Technology, inc., Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/939,229

(22) Filed: Nov. 12, 2015

(51) Int. Cl.
*H01L 29/06* (2006.01)
*H01L 45/00* (2006.01)

(52) U.S. Cl.
CPC ........... *H01L 45/1233* (2013.01); *H01L 45/06* (2013.01); *H01L 45/141* (2013.01); *H01L 45/146* (2013.01)

(58) Field of Classification Search
CPC .... H01L 45/1233; H01L 45/06; H01L 45/141; H01L 45/146
USPC .......................................................... 257/5
See application file for complete search history.

(56) References Cited

U.S. PATENT DOCUMENTS

| | | |
|---|---|---|
| 6,177,320 B1 | 1/2001 | Cho et al. |
| 6,897,522 B2 | 5/2005 | Harari et al. |
| 6,992,343 B2 | 1/2006 | Miyatake et al. |
| 8,084,801 B2 | 12/2011 | Baek et al. |
| 8,110,872 B2 | 2/2012 | Fujimoto |
| 8,129,709 B2 | 3/2012 | Seko et al. |
| 8,362,581 B2 | 1/2013 | Takenaga et al. |
| 8,665,629 B2 * | 3/2014 | Park ............... H01L 27/228 365/148 |
| 8,829,682 B2 | 9/2014 | Kim et al. |
| 8,957,483 B2 | 2/2015 | Gilgen |
| 8,962,476 B2 | 2/2015 | Lin et al. |
| 9,123,575 B1 * | 9/2015 | Satoh ............. H01L 27/10805 |
| 2005/0051831 A1 | 3/2005 | Kajimoto et al. |
| 2005/0087886 A1 | 4/2005 | Leinbach |
| 2008/0061340 A1 | 3/2008 | Heineck et al. |
| 2008/0259133 A1 | 10/2008 | Hara et al. |
| 2008/0303115 A1 | 12/2008 | Miyazaki et al. |

(Continued)

*Primary Examiner* — Xinning Niu
*Assistant Examiner* — Vu A Vu
(74) *Attorney, Agent, or Firm* — Bing K. Yen (57) ABSTRACT

The present invention is directed to a semiconductor memory device including a plurality of first level contacts arranged in a rectangular array with parallel columns directed along a first direction and parallel rows directed along a second direction. The rectangular array of the plurality of first level contacts have a first pitch and a second pitch along the first and second directions, respectively. The memory device further includes a first and second plurality of second level contacts formed on top of the first level contacts with the first plurality of second level contacts electrically connected to odd columns along the second direction of the first level contacts and the second plurality of second level contacts electrically connected to even columns of the first level contacts; and a first and second plurality of memory elements formed on top of the first and second plurality of second level contacts, respectively.

20 Claims, 8 Drawing Sheets

(56) References Cited

U.S. PATENT DOCUMENTS

| | | |
|---|---|---|
| 2009/0121268 A1 | 5/2009 | Lee et al. |
| 2010/0081395 A1 | 4/2010 | Woo et al. |
| 2012/0038005 A1 | 2/2012 | Burgess et al. |
| 2012/0049380 A1 | 3/2012 | Kim et al. |
| 2012/0199895 A1 | 8/2012 | Nitta |
| 2014/0042509 A1 | 2/2014 | Park et al. |
| 2015/0069377 A1 | 3/2015 | Rabkin et al. |

* cited by examiner

MEMORY DEVICE WITH INCREASED SEPARATION BETWEEN MEMORY ELEMENTS

BACKGROUND

The present invention relates to a semiconductor memory device, and more particularly, to exemplary embodiments of a memory cell structure that can increase the separation spacing between closest adjacent memory elements for a given memory cell size.

A memory device normally comprises an array of memory cells, each of which includes a memory element and a selection transistor coupled in series between two electrodes. The selection transistor functions like a switch to direct current or voltage through the selected memory element coupled thereto. Upon application of an appropriate voltage or current to the memory element, the electrical property of the memory element would change accordingly, thereby switching the stored logic in the respective memory cell.

A memory device may be either volatile or non-volatile, depending on the types of memory element and memory architecture used. An example of volatile memory devices is dynamic random access memory (DRAM), which loses its stored information when power is interrupted or lost. Non-volatile memory devices, such as magnetic random access memory (MRAM) or other types of resistance-based memory devices, can retain stored information when powered off.

A resistance-based memory element can be classified into at least one of several known groups based on its resistance switching mechanism. The memory element of Phase Change Random Access Memory (PCRAM) may comprise a phase change chalcogenide compound, which can switch between a resistive amorphous phase and a conductive crystalline phase. The memory element of Conductive Bridging Random Access Memory (CBRAM) relies on the statistical bridging of metal rich precipitates therein for its switching mechanism. The memory element of CBRAM normally comprises a nominally insulating metal oxide material, which can switch to a lower electrical resistance state as the metal rich precipitates grow and link to form conductive paths upon application of an appropriate voltage. The memory element of Magnetic Random Access Memory (MRAM) typically comprises at least two layers of ferromagnetic materials with an insulating tunnel junction layer interposed therebetween. When a switching current is applied to the memory element of an MRAM device, one of the ferromagnetic layers will switch its magnetization direction with respect to that of the other magnetic layer, thereby changing the electrical resistance of the element.

Figure 1:
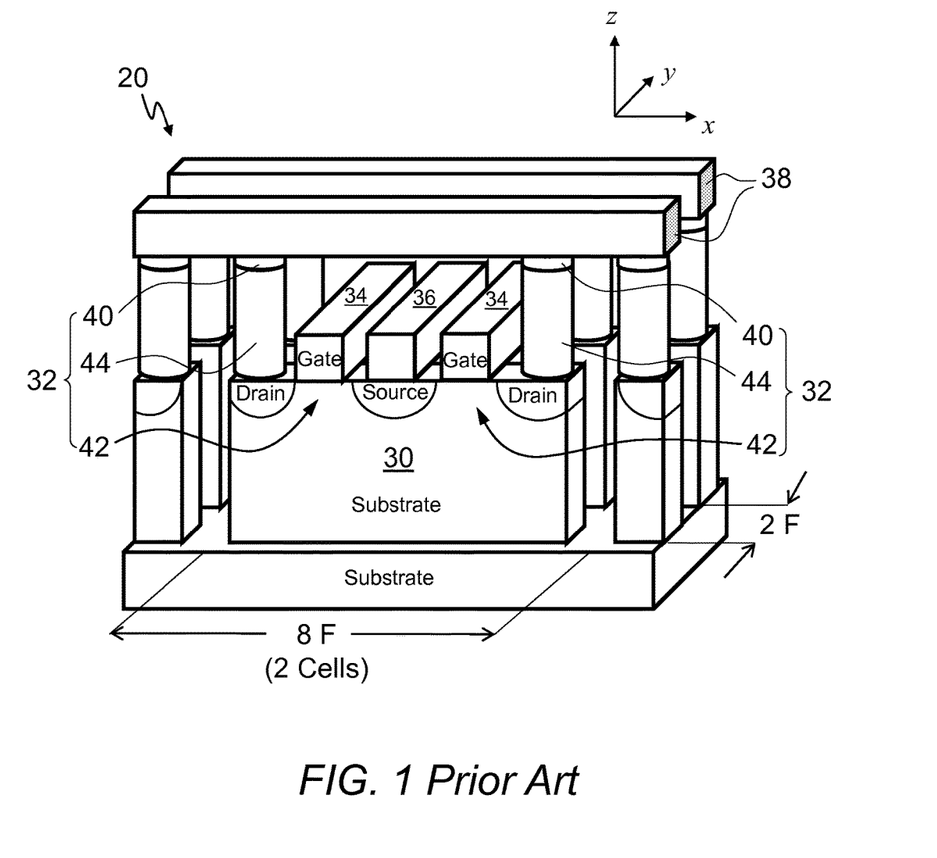
FIG. 1 is a perspective view of a conventional memory device that includes therein a plurality of resistance-based memory elements.

FIG. 1 is a perspective view of a conventional memory device 20 comprising a semiconductor substrate 30, a plurality of memory cells 32 formed thereon, a plurality of parallel gates 34 connecting to the cells 32 along the y-direction, a plurality of parallel common source lines 36 connecting the cells 32 along the y-direction, and a plurality of bit lines 38 connecting the cells 32 along the x-direction substantially perpendicular to the y-direction. In this drawing, the insulation material separating various elements is omitted for reasons of clarity. Each of the memory cells 32 further includes a resistance-based memory element 40 and a selection transistor 42 connected in series by way of a bit contact 44. Each selection transistor 42 includes a drain and a common source that is shared with an adjacent selection transistor. The bit contact 44 is formed on top of the drain. Each common source is coupled to one of the common source lines 36 formed thereon. The channel of the selection transistor 42 formed between the drain and the common source beneath the gate 34 has a length of about 1 F and a width of about 1 F, where F denotes the minimum feature size or one half the minimum feature pitch normally associated with a particular lithography process. In memory applications where memory cells are arranged in dense and repetitive patterns, photolithography is more constrained by the pitch of the feature pattern rather than the feature size itself. This is because the feature size can be modulated by photo lithography process conditions, such as exposure and resist development, but shrinkage of the feature pitch would require shorter wavelength light source and/or significant improvement in optics. In reality, the scaling of the device size in a dense array, such as that in memory applications, is limited by the minimum pitch of 2 F. Moreover, it is normally assumed that the minimum feature size is half of the corresponding minimum pitch. The illustrated conventional resistive memory device in FIG. 1 has cell dimensions of 4 F and 2 F in the directions of the bit lines 38 and the source lines 36, respectively, resulting in a cell size of 8 $F^2$.

Figure 2:
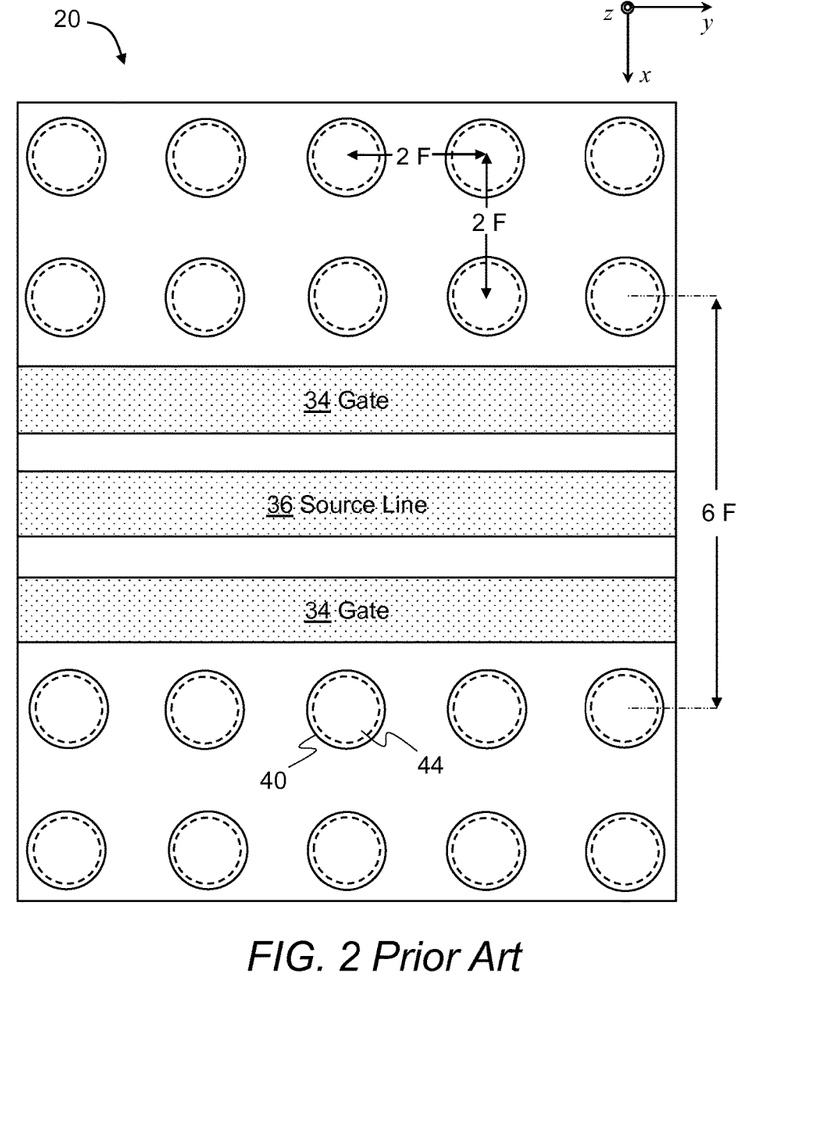
FIG. 2 is a top planar view of the conventional memory device of FIG. 1.

FIG. 2 is a top planar view of the conventional memory device 20 showing the placement of the gates 34, the common source lines 36, the memory elements 40, and the bit contacts 44 directly beneath the memory elements 40. For reasons of clarity, the bit lines 38 are not shown in order to expose the structure therebeneath. The center-to-center spacing between any one of the bit contacts 44 and the three closest neighbors thereof is 2 F. The memory elements 40, which are formed on top of the bit contacts 44, are subjected to the same geometric constraint with the center-to-center spacing between two closest neighbors being 2 F. Assuming each of the memory elements 40 has a diameter of about 1 F, then the gap or clearance between two closest adjacent memory elements 40 is only about 1 F. For 8 $F^2$ memory cell design, such as the one shown in FIGS. 1 and 2, it is desirable to increase the spacing or separation between two closest adjacent memory elements 40 in order to increase the gap therebetween for easing processing constraints or to increase the memory size for improving memory performance or both.

For the foregoing reasons, there is a need for an 8 $F^2$ memory device that has a minimum center-to-center spacing between adjacent memory elements greater than 2 F and that can be inexpensively manufactured.

SUMMARY

The present invention is directed to a device that satisfies this need. A semiconductor memory device having features of the present invention comprises a plurality of first level contacts arranged in a square array with columns directed along a first direction and rows directed along a second direction that is substantially perpendicular to the first direction. The square array of the plurality of first level contacts has every two rows vacant along the first direction, thereby forming multiple contact regions separated by multiple vacant regions along the first direction with each of the multiple contact regions comprising a first row and a second row of the first level contacts. The memory device further comprises a first and second plurality of second level contacts formed on top of the first level contacts and electrically connected thereto with the second plurality of second level contacts having elongated shape extending into the vacant regions adjacent thereto along the first direction; and a first and second plurality of memory elements formed on top of the first and second plurality of second level contacts, respectively. The first and second plurality of memory elements are arranged to have a greater center-to-center spacing between two closest neighbors than the first level contacts.

In an embodiment, the second plurality of memory elements electrically connected to odd columns along the second direction of the first rows of the first level contacts are disposed a first fixed distance from the respective first rows of the first level contacts in the first direction towards the vacant regions adjacent thereto; the second plurality of memory elements electrically connected to even columns of the second rows of the first level contacts are disposed a second fixed distance from the respective second rows of the first level contacts in a third direction towards the vacant regions adjacent thereto with the third direction being substantially opposite to the first direction. The first fixed distance and the second fixed distance may be substantially same as a center-to-center spacing between two closest neighbors of the first level contacts.

In another embodiment, the second plurality of memory elements electrically connected to even columns along the second direction of the first rows of the first level contacts are disposed a first fixed distance from the respective first rows of the first level contacts in the first direction towards the vacant regions adjacent thereto; the second plurality of memory elements electrically connected to odd columns of the second rows of the first level contacts are disposed a second fixed distance from the respective second rows of the first level contacts in a third direction towards the vacant regions adjacent thereto with the third direction being substantially opposite to the first direction. The first fixed distance and the second fixed distance may be substantially same as a center-to-center spacing between two closest neighbors of the first level contacts.

According to another aspect of the present invention, a semiconductor memory device including a plurality of first level contacts arranged in a rectangular array with parallel columns directed along a first direction and parallel rows directed along a second direction that is substantially perpendicular to the first direction. The rectangular array of the plurality of first level contacts have a first pitch and a second pitch along the first and second directions, respectively, with the first pitch substantially greater than the second pitch. The memory device further includes a first and second plurality of second level contacts formed on top of the first level contacts with the first plurality of second level contacts electrically connected to odd columns along the second direction of the first level contacts and the second plurality of second level contacts electrically connected to even columns of the first level contacts; and a first and second plurality of memory elements formed on top of the first and second plurality of second level contacts, respectively. Each of the first and second plurality of second level contacts has a dimension along the first direction that is greater or equal to another dimension along the second direction. The first and second plurality of memory elements are arranged to have a greater center-to-center spacing between two closest neighbors than the first level contacts. The first pitch may be about twice the second pitch. The memory device may further include a plurality of transistors with each memory element of the first and second plurality of memory elements electrically connected to two of the plurality of transistors.

In an embodiment, the first plurality of memory elements electrically connected to the odd columns of the first level contacts are disposed a first fixed distance therefrom in the first direction, the second plurality of memory elements electrically connected to the even columns of the first level contacts are disposed a second fixed distance therefrom in a third direction opposite to the first direction. The sum of the first fixed distance and the second fixed distance may be substantially equal to the second pitch. The first fixed distance and the second fixed distance may be substantially same.

In another embodiment, the second plurality of memory elements electrically connected to the even columns of the first level contacts are disposed a first fixed distance therefrom in the first direction, the first plurality of memory elements electrically connected to the odd columns of the first level contacts are disposed a second fixed distance therefrom in a third direction opposite to the first direction. The sum of the first fixed distance and the second fixed distance may be substantially equal to the second pitch. The first fixed distance and the second fixed distance may be substantially same.

BRIEF DESCRIPTION OF THE DRAWINGS

These and other features, aspects, and advantages of the present invention will become better understood with regard to the following description, appended claims, and accompanying drawings where:

For purposes of clarity and brevity, like elements and components will bear the same designations and numbering throughout the Figures, which are not necessarily drawn to scale.

DETAILED DESCRIPTION

In the Summary above and in the Detailed Description, and the claims below, and in the accompanying drawings, reference is made to particular features of the invention. It is to be understood that the disclosure of the invention in this specification includes all possible combinations of such particular features. For example, where a particular feature is disclosed in the context of a particular aspect or embodiment of the invention, or a particular claim, that feature can also be used, to the extent possible, in combination with and/or in the context of other particular aspects and embodiments of the invention, and in the invention generally.

Where reference is made herein to a material AB composed of chemical element A and chemical element B, the material AB can be an alloy, a compound, or a combination thereof, except where the context excludes that possibility.

The term "at least" followed by a number is used herein to denote the start of a range beginning with that number, which may be a range having an upper limit or no upper limit, depending on the variable being defined. For example, "at least 1" means 1 or more than 1. The term "at most" followed by a number is used herein to denote the end of a range ending with that number, which may be a range having 1 or 0 as its lower limit, or a range having no lower limit, depending upon the variable being defined. For example, "at most 4" means 4 or less than 4, and "at most 40%" means 40% or less than 40%. When, in this specification, a range is given as "(a first number) to (a second number)" or "(a first number)-(a second number)," this means a range whose lower limit is the first number and whose upper limit is the second number. For example, "25 to 100 nm" means a range whose lower limit is 25 nm and whose upper limit is 100 nm.

Figure 3:
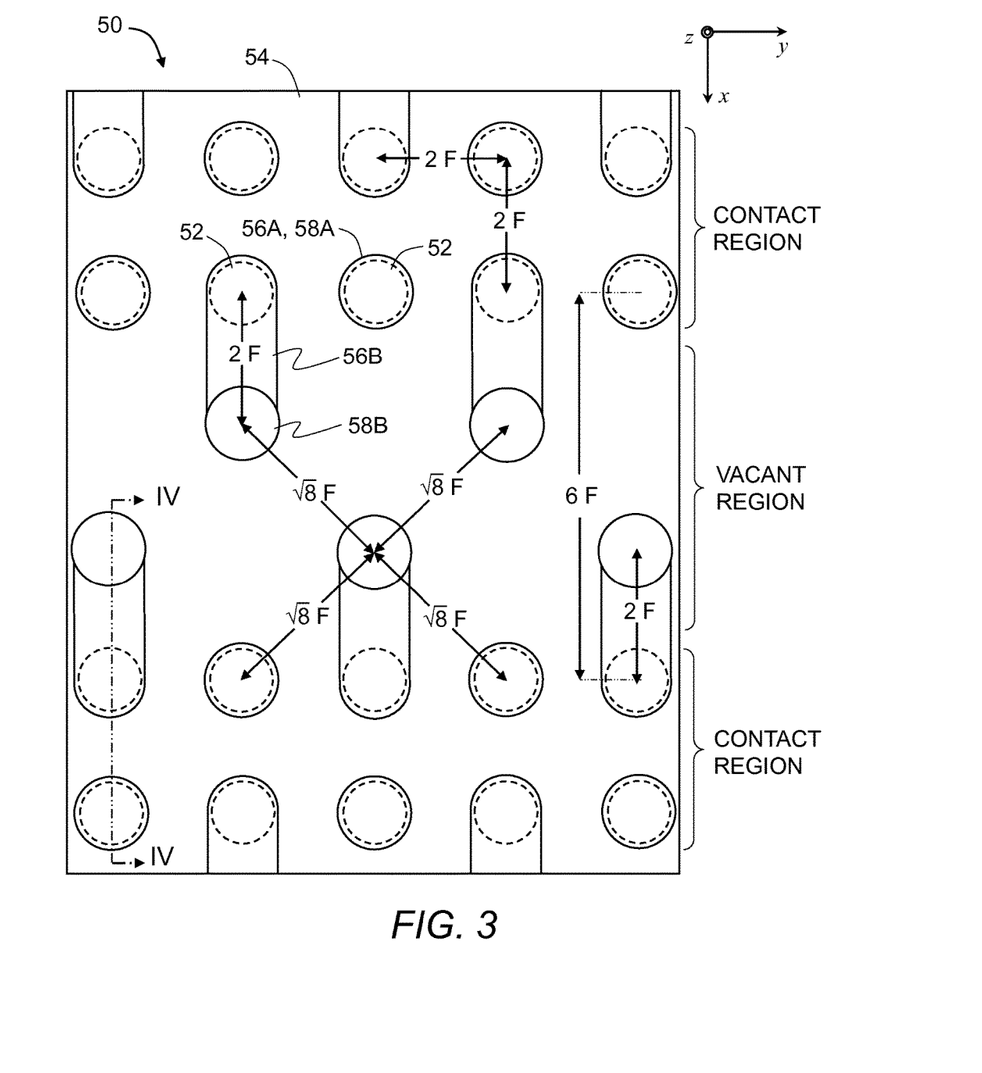
FIG. 3 is a top planar view of an upper portion of a memory device with increased center-to-center spacing between closest adjacent memory elements according to an embodiment of the present invention.
Figure 4:
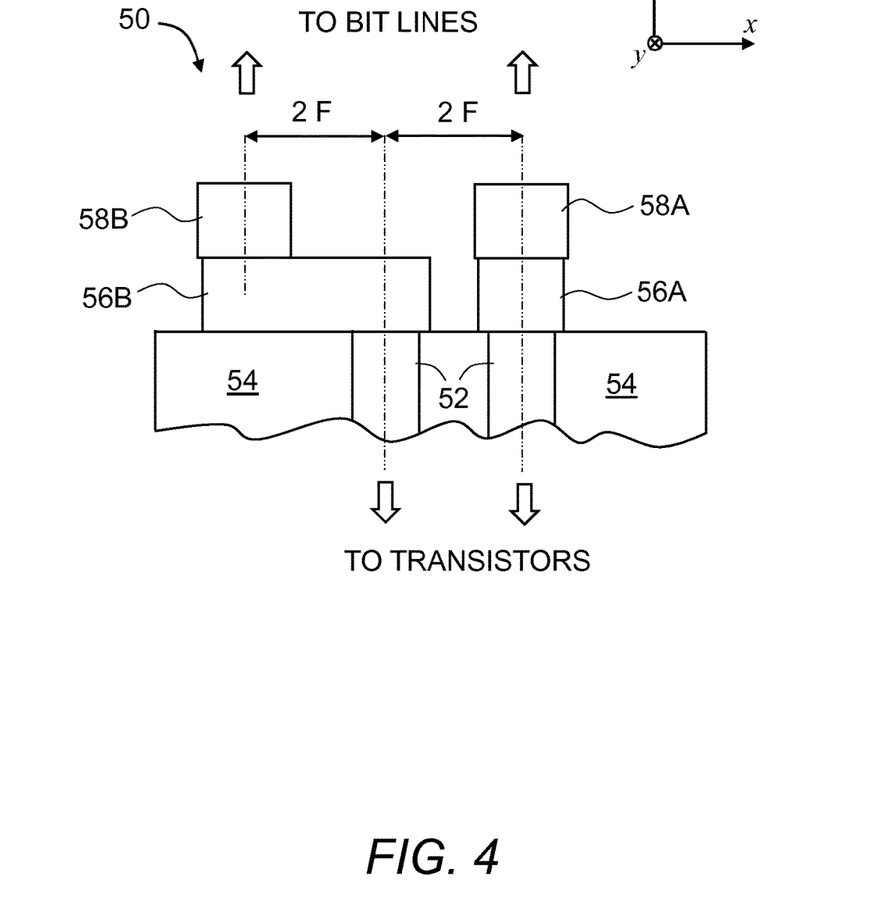
FIG. 4 is a cross sectional view of the memory device of FIG. 3.

An embodiment of the present invention as applied to an 8 $F^2$ memory device 50 will now be described with reference to FIGS. 3 and 4, which are a top planar view and a cross sectional view of the memory device 50, respectively. Referring now to FIG. 4, the illustrated memory device 50 includes a plurality of bit contacts 52 surrounded by an insulating layer 54. Each of the bit contacts 52 is coupled to a drain of a selection transistor (not shown) therebeneath. The structure of the memory device 50 below the stop surface of the bit contacts 52, including the bit contacts 52, selection transistors, source lines, and gates, is substantially identical to that of the memory device 20 of FIG. 1. Like the memory device 20 of FIGS. 1 and 2, the plurality of bit contacts 52 of the memory device 50 are arranged in a square array with every two rows vacant in the x-direction, thereby forming multiple contact regions separated by vacant regions as illustrated in FIG. 3. Each contact region includes two rows of the bit contacts 52 arranged in a square array with a pitch of 2 F and extending along the y-direction. The center-to-center spacing between two bit contacts 52 on opposite sides of a vacant region along a column in the x-direction is 6 F.

With continuing reference to FIGS. 3 and 4, two types of memory contacts 56A and 56B are formed on top of the bit contacts 52 and electrically connected thereto: standard memory contacts 56A with a substantially circular or equi-axed cross section when view from top and extended memory contacts 56B with substantially elongated shape extending along the positive and negative y-directions into the vacant regions. A first plurality of memory elements 58A and a second plurality of memory elements 58B are formed on top of the standard memory contacts 56A and the extended memory contacts 56B, respectively. Instead of confining all memory elements directly above the bit contacts 52 in the contact regions like the memory device 20 of FIGS. 1 and 2, the extended memory contacts 56B with elongated shape shift the second plurality of memory elements 58B towards the vacant regions adjacent to the respective bit contacts 52 in order to increase the center-to-center spacing between two closest adjacent memory elements 58A and 58B. The second plurality of memory elements 58B may be electrically connected to odd columns of a first row and even columns of a second row of the bit contacts 52 in each contact region via the extended memory contacts 56B. Alternatively, the second plurality of memory elements 58B may be electrically connected to even columns of a first row and odd columns of a second row of the bit contacts 52 in each contact region.

The second plurality of memory elements 58B may shift a distance from the bit contacts 52 connected thereto towards the vacant regions adjacent to the respective bit contacts 52 along the positive and negative y-directions. In an embodiment, the shifted distance is substantially same as the center-to-center spacing of d between two closest adjacent bit contacts 52, which would result in the memory elements 58A and 58B forming a rotated square array with a pitch of d√2. If d is equal to 2 F, then the shifted distance would be 2 F and the array of the memory elements 58A and 58B would have a pitch of 2√2 F. Therefore, the center-to-center spacing between two closest adjacent memory elements 58A and 58B is √2 times that between two closest adjacent bit contacts 52.

It should be noted that the bit contacts 52, the memory contacts 56A and 56B, and the memory elements 58A and 58B do not have to be directly coupled to each other as illustrated in FIG. 4. One or more additional contacts or conductive structures may be inserted between the bit contacts 52 and the memory contacts 56A and 56B and/or between the memory contacts 56A and 56B and the memory elements 58A and 58B.

The first and second plurality of memory elements 58A and 58B are substantially identical except for the underlying memory contacts 56A and 56B. The memory elements 58A and 58B may switch their resistance state by any suitable switching mechanism, such as but not limited to phase change, precipitate bridging, magnetoresistive switching, or any combination thereof. In one embodiment, each of the memory elements 58A and 58B comprises a phase change chalcogenide compound, such as but not limited to $Ge_2Sb_2Te_5$ or AgInSbTe, which can switch between a resistive amorphous phase and a conductive crystalline phase. In another embodiment, each of the memory elements 58A and 58B comprises a nominally insulating metal oxide material, such as but not limited to NiO, $TiO_2$, or $Sr(Zr)TiO_3$, which can switch to a lower electrical resistance state as the metal rich precipitates grow and link to form conductive paths upon application of an appropriate voltage. In still another embodiment, each of the memory elements 58A and 58B comprises two layers of ferromagnetic materials with an insulating electron tunnel junction layer interposed therebetween, collectively forming a magnetic tunnel junction. When a switching pulse is applied, one of the ferromagnetic layers would switch its magnetization direction, thereby changing the electrical resistance of the element.

Figure 5:
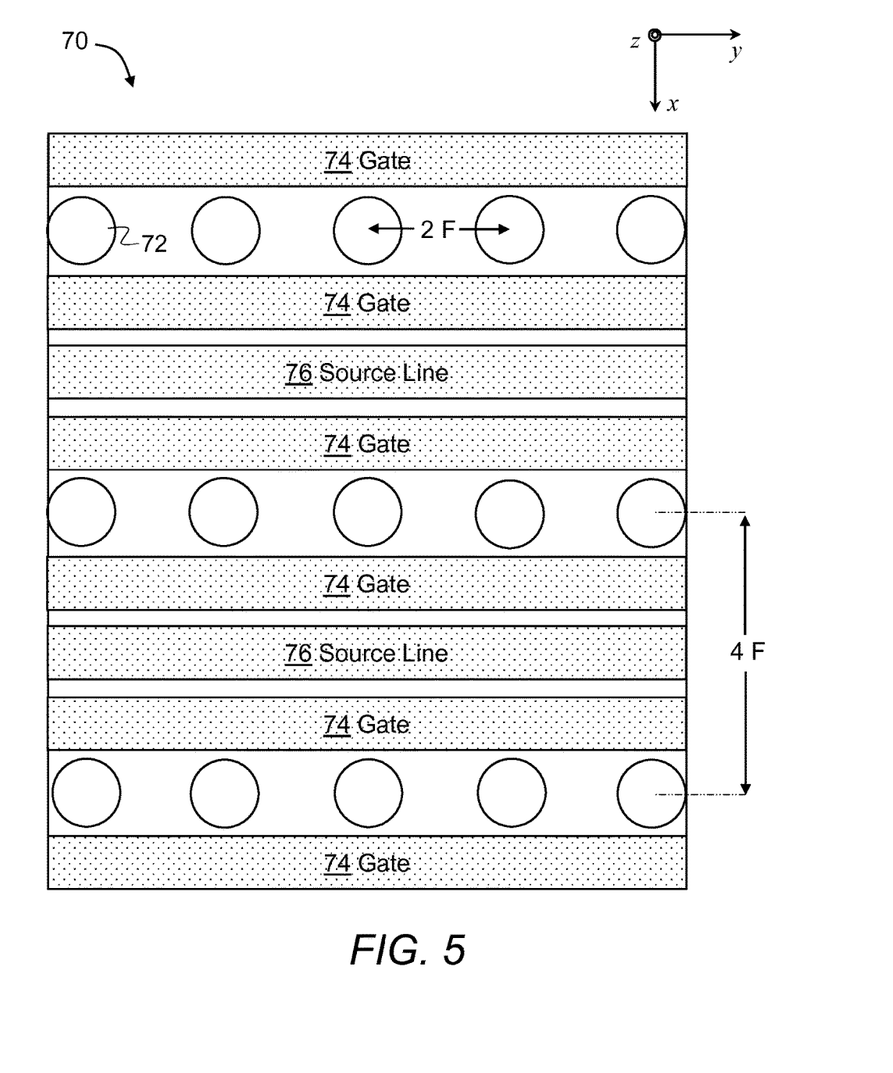
FIG. 5 is a top planar view of a lower portion of another memory device embodying features of the present invention.

FIG. 5 is a top planar view of a lower portion of another 8 $F^2$ memory device embodying features of the present invention. The illustrated memory device 70 includes a plurality of bit contacts 72 arranged in a rectangular array having pitches of 2 F and 4 F along the y-direction and x-direction, respectively. Each of the bit contacts 72 is electrically connected to a memory element (not shown) thereabove and is coupled to a common drain (not shown) therebeneath that is shared by a pair of selection transistors (not shown). Therefore, the memory device 70 utilizes a pair of selection transistors to drive a memory element. Two adjacent rows of the bit contacts 72 are separated along the x-direction by two of a plurality of gates 74 and one of a plurality of source lines 76 extending along the y-direction.

Figure 6:
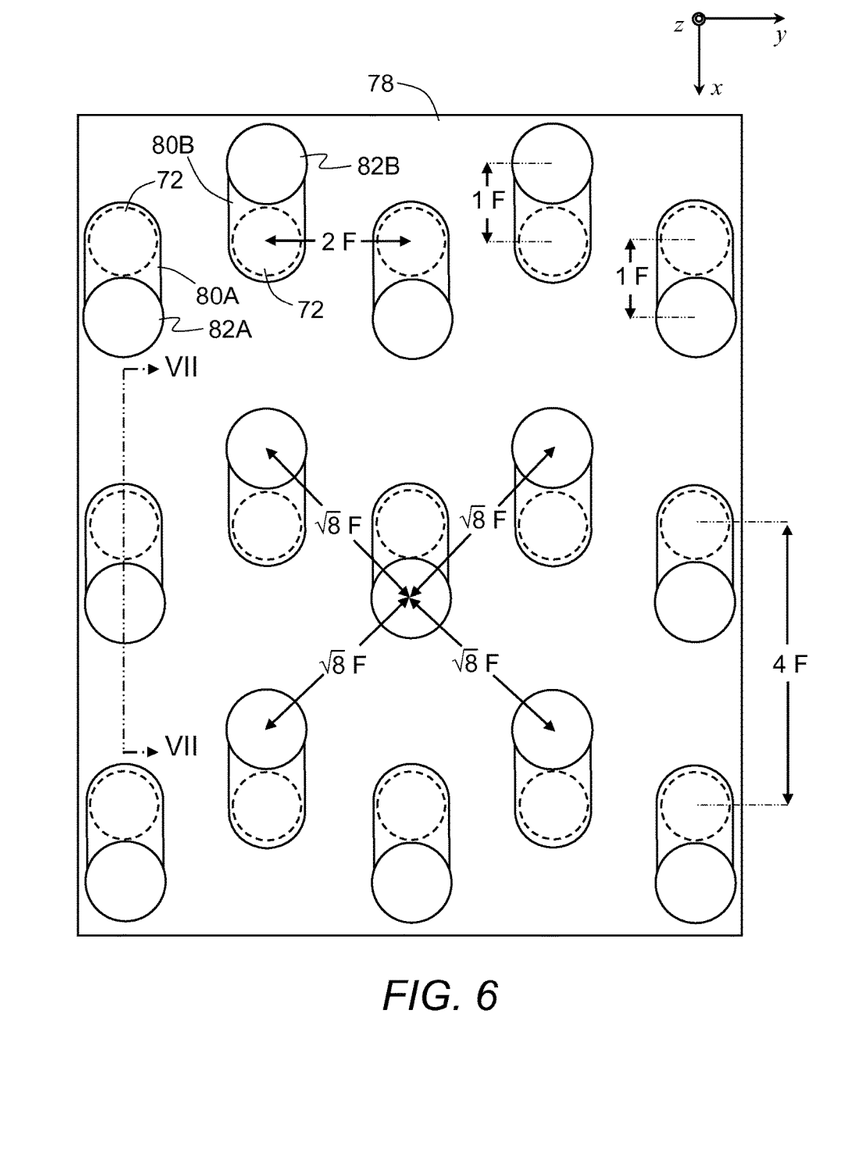
FIG. 6 is a top planar view of an upper portion of the memory device of FIG. 5 showing increased center-to-center spacing between closest adjacent memory elements according to an embodiment of the present invention.

FIG. 6 is a top planar view of an upper portion of the memory device of FIG. 5 showing the structure thereof above the top surface of the bit contacts 72, which are surrounded by an insulating layer 78. The bit contacts 72 in the odd columns extending along the x-direction have first memory contacts 80A formed thereon, while the bit contacts 72 in the even columns have second memory contacts 80B formed thereon. The first memory contacts 80A may have substantially elongated shape that may extend in the positive or negative x-direction. The second memory contacts 80B may have substantially elongated shape that extends in a direction opposite to that of the first memory contacts 80A. A first plurality of memory elements 82A and a second plurality of memory elements 82B are formed on top of the first memory contacts 80A and the second memory contacts 80B, respectively. The first plurality of memory elements 82A in the odd columns are shifted a distance of $d_1$ in the positive or negative x-direction from the respective bit contacts 72 electrically connected thereto via the first memory contacts 80A. The second plurality of memory elements 82B in the even columns are shifted a distance of $d_2$ in the positive or negative x-direction opposite that of the odd column from the respective bit contacts 72 electrically connected thereto via the second memory contacts 80B. In an embodiment, the first plurality of memory elements 82A in the odd columns shifts 1 F with respect to the bit contacts 72 in the positive x-direction, while the second plurality of memory elements 82B in the even columns shifts 1 F with respect to the bit contacts 72 in the negative x-direction, resulting in the memory elements 82A and 82B forming a rotated square array with a pitch or center-to-center distance of $2\sqrt{2}$ F as illustrated in FIG. 6. Therefore, the center-to-center spacing between two closest adjacent memory elements 82A and 82B is $\sqrt{2}$ times that between two closest adjacent bit contacts 72.

The first and second plurality of memory elements 82A and 82B are substantially identical except for the underlying memory contacts 80A and 80B. The memory elements 82A and 82B may be made of any suitable memory material or structure as described above, such as but not limited to a phase change chalcogenide compound or magnetic tunnel junction. The memory elements 82A and 82B may be electrically connected to bit lines (not shown) disposed thereabove. The bit lines may extend along the x-direction or one of the diagonal directions in which the array of the memory elements 82A and 82B has a minimum pitch.

Figure 7:
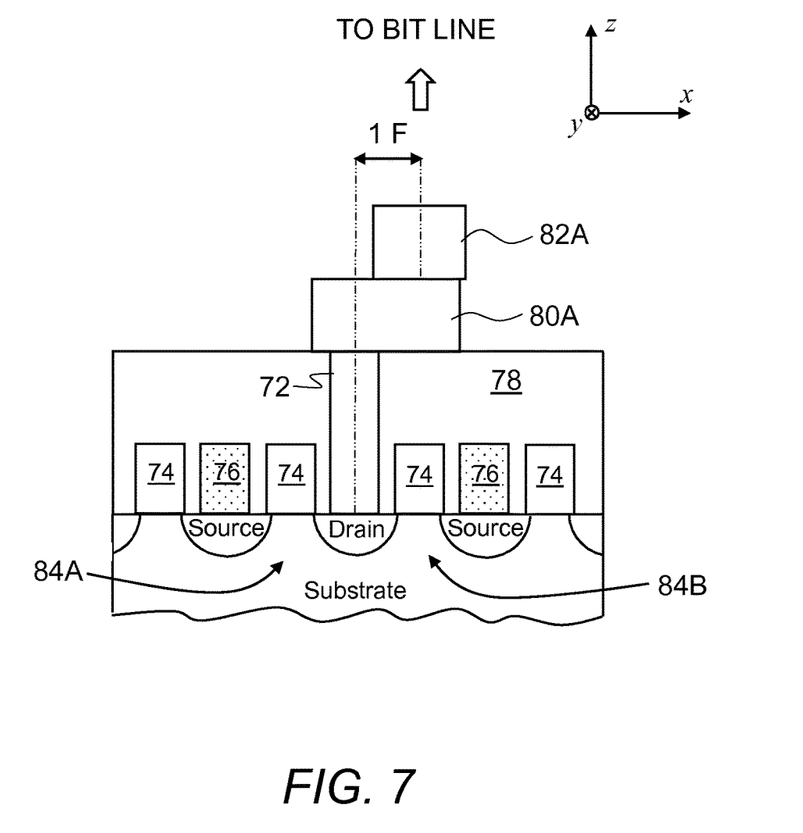
FIG. 7 is a cross sectional view of the memory device of FIG. 6 exposing a memory element and the surrounding structure thereof.

FIG. 7 is a cross sectional view of the memory device of FIG. 6 exposing one of the first plurality of memory elements 82A and the surrounding structure thereof. Referring now to FIG. 7, the memory element 82A is disposed on top of one end of a first memory contact 80A, which has an elongated shape extending along the x-direction. The other end of the first memory contact 80A is coupled to a bit contact 72 therebeneath. The memory element 82A is shifted by a distance of 1 F in the positive x-direction with respect to the bit contact 72 electrically connected thereto via the first memory contact 80A.

With continuing reference to FIG. 7, the bit contact 72 is coupled to a common drain therebeneath that is shared by a pair of selection transistors 84A and 84B. Each of the pair of the selection transistors 84A and 84B further includes a common source that is shared with another adjacent transistor. The source lines 76, which extend along the y-direction, are formed on top of the common sources and connect to common sources of other selection transistors along the y-direction. The common source and drain with a first type conductivity are formed in a semiconductor substrate, which may have a second type conductivity opposite to the first type. Each of the gates 74, which extends along the y-direction, is formed on top of the semiconductor substrate between a common source and a common drain and connects to other selection transistors along the y-direction. Two of the gates 74 disposed adjacent to the bit contact 72 may be selected when reading or writing to the memory element 82A, thereby providing twice amount of current to the memory element 82A compared with the single selection transistor configuration. It should be noted that the bit contact 72, the memory contact 80A, and the memory element 82A do not have to be directly coupled to each other. One or more additional contacts or conductive structures may be inserted between the bit contact 72 and the memory contact 80A and/or between the memory contact 80A and the memory element 82A.

Figure 8:
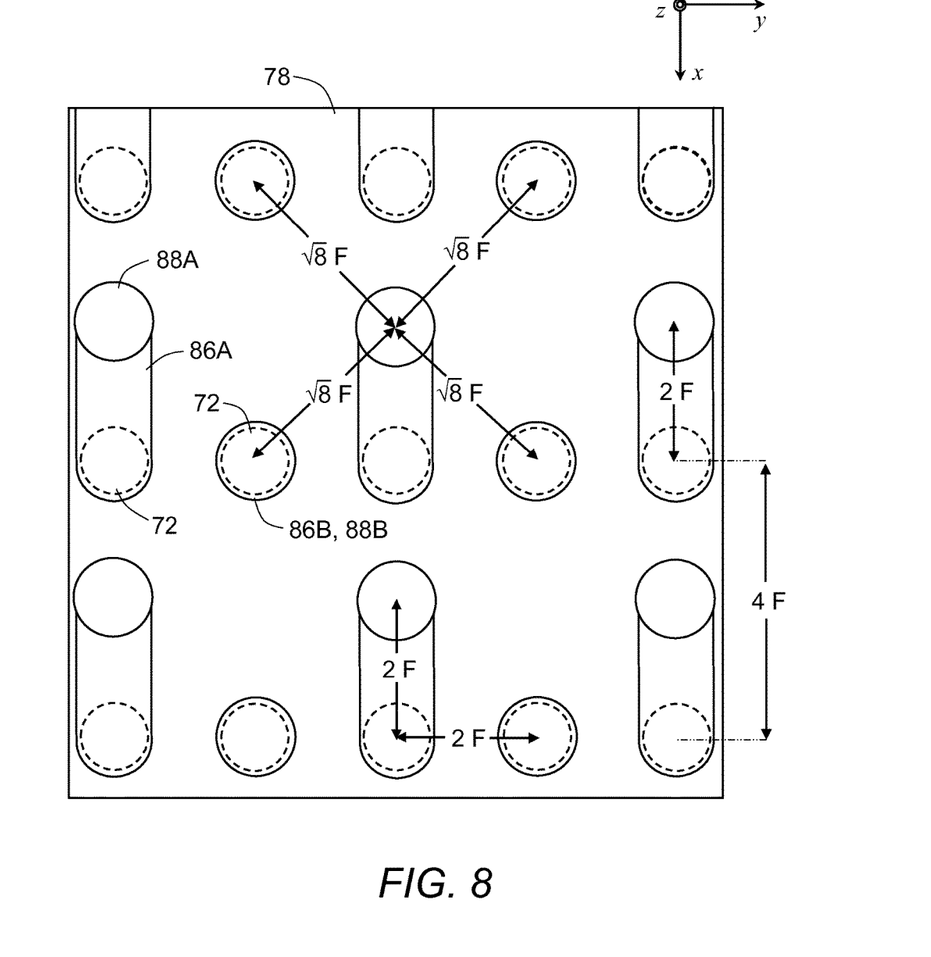
FIG. 8 is a top planar view of another upper portion of the memory device of FIG. 5 showing increased center-to-center spacing between closest adjacent memory elements according to another embodiment of the present invention.

FIG. 8 is a top planar view of another upper portion of the memory device of FIG. 5 showing the structure thereof above the top surface of the bit contacts 72, which are surrounded by an insulating layer 78, in accordance with another embodiment of the present invention. The bit contacts 72 in the odd columns extending along the x-direction have first memory contacts 86A formed thereon, while the bit contacts 72 in the even columns have second memory contacts 86B formed thereon. Each of the first and second memory contacts 86A and 86B may have a dimension in the x-direction that is greater or equal to another dimension in the y-direction. A first plurality of memory elements 88A and a second plurality of memory elements 88B are formed on top of the first memory contacts 86A and the second memory contacts 86B, respectively. The first plurality of memory elements 88A in the odd columns are shifted a distance of $d_1$ in the positive or negative x-direction from the respective bit contacts 72 electrically connected thereto via the first memory contacts 86A. The second plurality of memory elements 88B in the even columns are shifted a distance of $d_2$ in the positive or negative x-direction opposite that of the odd column from the respective bit contacts 72 electrically connected thereto via the second memory contacts 86B. In the current embodiment illustrated in FIG. 8, the first plurality of memory elements 88A in the odd column shift a distance of 2 F (i.e. $d_1=2$ F) in the negative x-direction with respect to the bit contacts 72 electrically connected thereto, while the second plurality of memory elements 88B in the even columns do not shift (i.e. $d_2=0$), resulting in the memory elements 88A and 88B forming a rotated square array with a pitch or center-to-center spacing of $2\sqrt{2}$ F.

The first and second plurality of memory elements 88A and 88B are substantially identical except for the underlying memory contacts 86A and 86B. The memory elements 88A and 88B may be made of any suitable memory material or structure as described above, such as but not limited to a phase change chalcogenide compound or magnetic tunnel junction. The memory elements 88A and 88B may be electrically connected to bit lines (not shown) disposed thereabove. The bit lines may extend along the x-direction or one of the diagonal directions in which the array of the memory elements 88A and 88B has a minimum pitch.

In addition to the exemplary embodiments shown in FIGS. 6 and 8, there are several other ways to arrange the memory elements of the 8 $F^2$ memory device of FIG. 5 to increase the minimum center-to-center spacing. The center-to-center spacing between two closest adjacent memory elements will be $2\sqrt{2}$ F or $\sqrt{2}$ times that between two closest adjacent bit contacts if the requirement $d_1+d_2=2$ F is satisfied. It should be noted that the present invention can be extended to other memory devices whose bit contacts are arranged in a rectangular array with a minimum pitch of p in a first direction and another pitch of 2p in a second direction substantially perpendicular to the first direction. For such memory devices, the center-to-center spacing between two closest adjacent memory elements will be √2 times that between two closest adjacent bit contacts if the requirement $d_1+d_2=p$ is satisfied.

While the present invention has been shown and described with reference to certain preferred embodiments, it is to be understood that those skilled in the art will no doubt devise certain alterations and modifications thereto which nevertheless include the true spirit and scope of the present invention. For example, the present invention of using extended memory contacts to increase the center-to-center spacing between adjacent memory elements by moving some memory elements from the contact regions to the vacant regions can be applied to other array arrangements for the bit contacts. Thus the scope of the invention should be determined by the appended claims and their legal equivalents, rather than by examples given.

What is claimed is:

1. A semiconductor memory device comprising:
a plurality of first level contacts arranged in a square array with columns directed along a first direction and rows directed along a second direction that is substantially perpendicular to said first direction, said square array of said plurality of first level contacts having every third and fourth rows vacant along said first direction, thereby forming multiple contact regions separated by multiple vacant regions along said first direction with each of said multiple contact regions comprising a first row and a second row of said first level contacts;
a first and second plurality of second level contacts formed on top of said first level contacts and electrically connected thereto, said second plurality of second level contacts having elongated shape extending into said vacant regions adjacent thereto along said first direction; and
a first and second plurality of memory elements formed on top of said first and second plurality of second level contacts, respectively,
wherein said first and second plurality of memory elements are arranged to have a greater center-to-center spacing between two closest neighbors than said first level contacts.

2. The semiconductor memory device of claim 1, wherein said second plurality of memory elements electrically connected to odd columns along said second direction of said first rows of said first level contacts are disposed a first fixed distance from said respective first rows of said first level contacts in said first direction towards said vacant regions adjacent thereto, said second plurality of memory elements electrically connected to even columns of said second rows of said first level contacts are disposed a second fixed distance from said respective second rows of said first level contacts in a third direction towards said vacant regions adjacent thereto with said third direction being substantially opposite to said first direction.

3. The semiconductor memory device of claim 2, wherein said first fixed distance and said second fixed distance are substantially same as a center-to-center spacing between two closest neighbors of said first level contacts.

4. The semiconductor memory device of claim 1, wherein said second plurality of memory elements electrically connected to even columns along said second direction of said first rows of said first level contacts are disposed a first fixed distance from said respective first rows of said first level contacts in said first direction towards said vacant regions adjacent thereto, said second plurality of memory elements electrically connected to odd columns of said second rows of said first level contacts are disposed a second fixed distance from said respective second rows of said first level contacts in a third direction towards said vacant regions adjacent thereto with said third direction being substantially opposite to said first direction.

5. The semiconductor memory device of claim 4, wherein said first fixed distance and said second fixed distance are substantially same as a center-to-center spacing between two closest neighbors of said first level contacts.

6. The semiconductor memory device of claim 1, wherein said second plurality of memory elements are shifted a fixed distance from said first level contacts electrically connected thereto towards said vacant regions adjacent thereto in said first direction or in a direction opposite to said first direction.

7. The semiconductor memory device of claim 1, wherein each memory element of said first and second plurality of memory elements has at least two resistance states.

8. A semiconductor memory device comprising:
a plurality of first level contacts arranged in a rectangular array with parallel columns directed along a first direction and parallel rows directed along a second direction that is substantially perpendicular to said first direction, said rectangular array of said plurality of first level contacts having a first constant pitch and a second constant pitch along said first and second directions, respectively, with said first constant pitch substantially greater than said second constant pitch;
a first and second plurality of second level contacts formed on top of said first level contacts, said first plurality of second level contacts electrically connected to odd columns along said second direction of said first level contacts, said second plurality of second level contacts electrically connected to even columns of said first level contacts, each of said first and second plurality of second level contacts having a dimension along said first direction that is greater or equal to another dimension along said second direction; and
a first and second plurality of memory elements formed on top of said first and second plurality of second level contacts, respectively,
wherein said first and second plurality of memory elements are arranged to have a greater center-to-center spacing between two closest neighbors than said first level contacts.

9. The semiconductor memory device of claim 8, wherein said first constant pitch is about twice said second constant pitch.

10. The semiconductor memory device of claim 8, wherein each memory element of said first and second plurality of memory elements has at least two resistance states.

11. The semiconductor memory device of claim 8, wherein each memory element of said first and second plurality of memory elements comprises a phase change chalcogenide compound.

12. The semiconductor memory device of claim 8, wherein each memory element of said first and second plurality of memory elements comprises a precipitate bridging metal oxide.

13. The semiconductor memory device of claim 8, wherein each memory element of said first and second plurality of memory elements comprises two ferromagnetic magnetic layers with an insulating tunnel junction layer interposed therebetween.

14. The semiconductor memory device of claim 8 further comprising a plurality of transistors with each memory element of said first and second plurality of memory elements electrically connected to two of said plurality of transistors.

15. The semiconductor memory device of claim 8, wherein said first plurality of memory elements electrically connected to said odd columns of said first level contacts are disposed a first fixed distance therefrom in said first direction, said second plurality of memory elements electrically connected to said even columns of said first level contacts are disposed a second fixed distance therefrom in a third direction opposite to said first direction.

16. The semiconductor memory device of claim 15, wherein sum of said first fixed distance and said second fixed distance is substantially equal to said second constant pitch.

17. The semiconductor memory device of claim 16, wherein said first fixed distance and said second fixed distance are substantially same.

18. The semiconductor memory device of claim 8, wherein said second plurality of memory elements electrically connected to said even columns of said first level contacts are disposed a first fixed distance therefrom in said first direction, said first plurality of memory elements electrically connected to said odd columns of said first level contacts are disposed a second fixed distance therefrom in a third direction opposite to said first direction.

19. The semiconductor memory device of claim 18, wherein sum of said first fixed distance and said second fixed distance is substantially equal to said second constant pitch.

20. The semiconductor memory device of claim 19, wherein said first fixed distance and said second fixed distance are substantially same.

\* \* \* \* \*